United States Patent
Huang et al.

(10) Patent No.: US 10,204,959 B2
(45) Date of Patent: Feb. 12, 2019

(54) SEMICONDUCTOR IMAGE SENSING DEVICE AND MANUFACTURING METHOD THEREOF

(71) Applicant: TAIWAN SEMICONDUCTOR MANUFACTURING COMPANY LTD., Hsinchu (TW)

(72) Inventors: Chien-Chang Huang, Hsinchu (TW); Li-Ming Sun, Tainan (TW); Chien Nan Tu, Kaohsiung (TW); Yi-Ping Pan, Taipei (TW); Yu-Lung Yeh, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/583,433

(22) Filed: Dec. 26, 2014

(65) Prior Publication Data
US 2015/0287761 A1 Oct. 8, 2015

Related U.S. Application Data

(63) Continuation-in-part of application No. 14/244,562, filed on Apr. 3, 2014, now Pat. No. 9,337,229.

(51) Int. Cl.
*H01L 27/146* (2006.01)

(52) U.S. Cl.
CPC .... *H01L 27/14685* (2013.01); *H01L 27/1462* (2013.01); *H01L 27/1464* (2013.01); *H01L 27/14625* (2013.01); *H01L 27/14698* (2013.01)

(58) Field of Classification Search
CPC .......... H01L 27/1464; H01L 27/14685; H01L 27/14625
USPC .......................................................... 438/71
See application file for complete search history.

(56) References Cited

U.S. PATENT DOCUMENTS

| | | | | |
|---|---|---|---|---|
| 2011/0291219 A1* | 12/2011 | Kwon | ................ | H01L 27/1463 257/447 |
| 2012/0111396 A1* | 5/2012 | Saylor | ................ | H01L 31/1804 136/255 |
| 2014/0078356 A1* | 3/2014 | Vaartstra | ........... | H01L 27/14629 348/273 |
| 2015/0061062 A1* | 3/2015 | Lin | ................... | H01L 27/14643 257/432 |
| 2015/0243694 A1* | 8/2015 | Ihara | ................ | H01L 27/14605 257/443 |

* cited by examiner

*Primary Examiner* — Daniel Whalen
(74) *Attorney, Agent, or Firm* — WPAT, P.C., Intellectual Property Attorneys; Anthony King

(57) ABSTRACT

A semiconductor device includes a substrate including a front side, a back side opposite to the front side, and a high absorption structure disposed over the back side of the substrate and configured to absorb an electromagnetic radiation in a predetermined wavelength; and a dielectric layer including a high dielectric constant (high k) dielectric material, wherein the dielectric layer is disposed on the high absorption structure.

20 Claims, 15 Drawing Sheets

SEMICONDUCTOR IMAGE SENSING DEVICE AND MANUFACTURING METHOD THEREOF

PRIORITY CLAIM AND CROSS-REFERENCE

This application is a Continuation-in-Part (CIP) application of U.S. application Ser. No. 14/244,562 filed on Apr. 3, 2014, entitled "Semiconductor Device And Manufacturing Method Thereof", the disclosure of which is hereby incorporated by reference in its entirety.

BACKGROUND

Electronic equipment using semiconductor devices are essential for many modern applications. Semiconductor image sensors are commonly involved in electronic equipment used for sensing light. Complementary metal-oxide-semiconductor (CMOS) image sensors are widely used in various applications, such as digital camera and mobile phone cameras. The CMOS image sensor typically includes an array of picture elements (pixels). Each pixel includes a transistor, a capacitor and a photo-diode. An electrical energy is induced in the photo-diode upon exposure to the light. Each pixel generates electrons proportional to an amount of light falling on the pixel. The electrons are converted into a voltage signal in the pixel and further transformed into digital signal.

The CMOS image sensors are classified as front side illuminated (FSI) image sensors and back side illuminated (BSI) image sensors, depending on the light path difference. The BSI image sensors are gaining in popularity. The light is incident on a back side of a substrate of the BSI image sensor and hits the photo-diode directly without obstruction from dielectric layers and interconnect layers formed on the substrate. Such a direct incidence makes the BSI image sensor more sensitive to the light.

However, as technologies evolve, the image sensor device is becoming increasingly smaller in size while having greater functionality and greater amounts of integrated circuitry. The BSI image sensor has been shrunk to a smaller pixel pitch and thus leads to undesirable performance of the BSI image sensor. Therefore, there is a continuous need to improve a structure and a manufacturing method for of the BSI image sensor device in order to improve the performance of the BSI image sensor device (e.g. increase quantum efficiency and full well capacity) as well as reduce cost and time on processing the BSI image sensor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
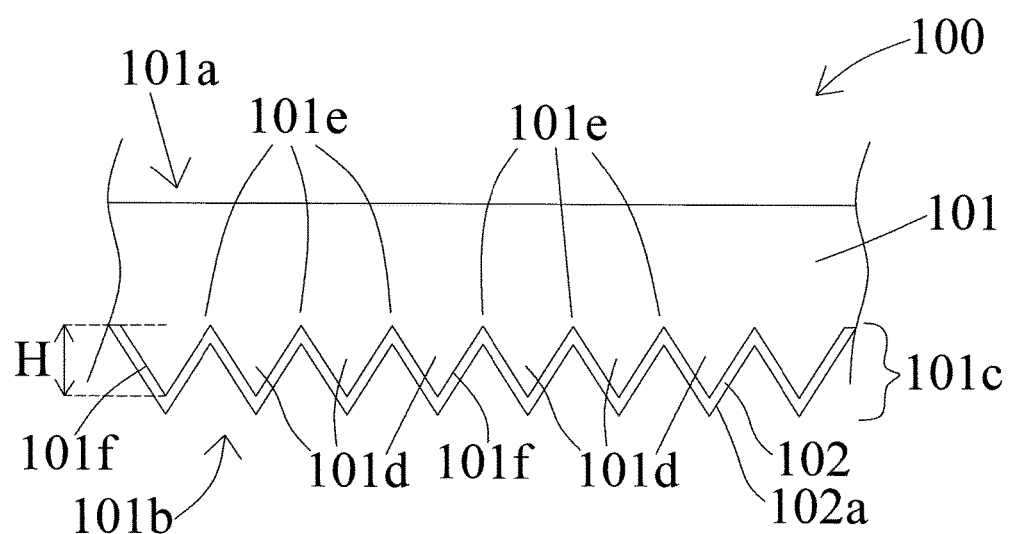
FIG. 1 is a schematic view of a semiconductor device in accordance with some embodiments of the present disclosure.
Figure 2:
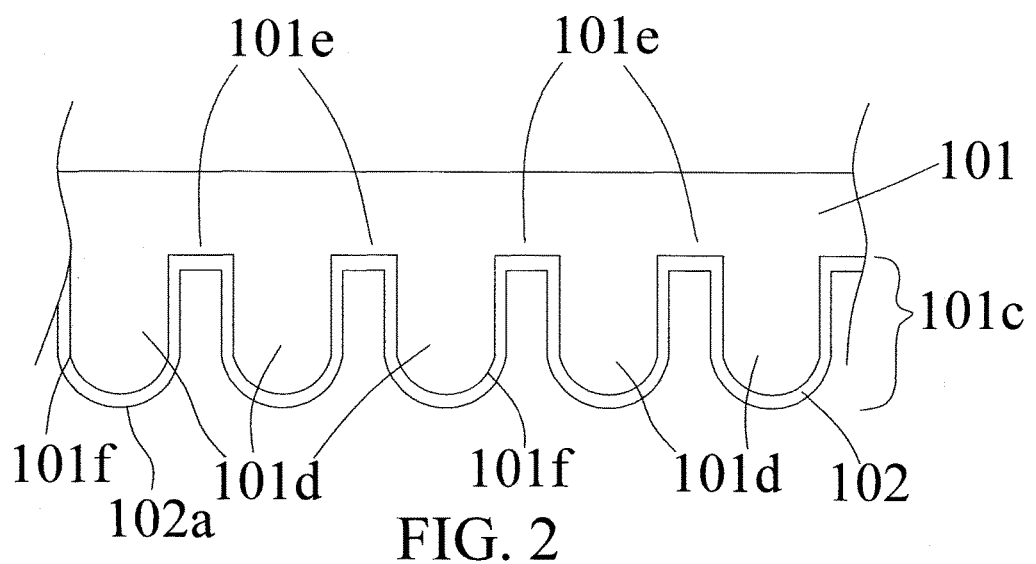
FIG. 2 is a schematic view of a semiconductor device with a high absorption structure in a cylindrical shape with a dome head in accordance with some embodiments of the present disclosure.
Figure 3:
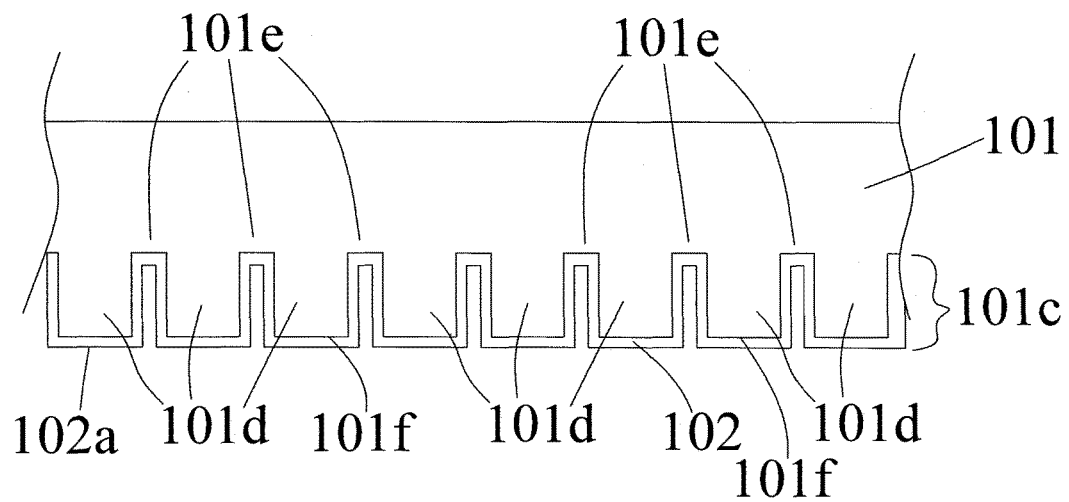
FIG. 3 is a schematic view of a semiconductor device with a high absorption structure in a cylindrical or pillar shape in accordance with some embodiments of the present disclosure.
Figure 4:
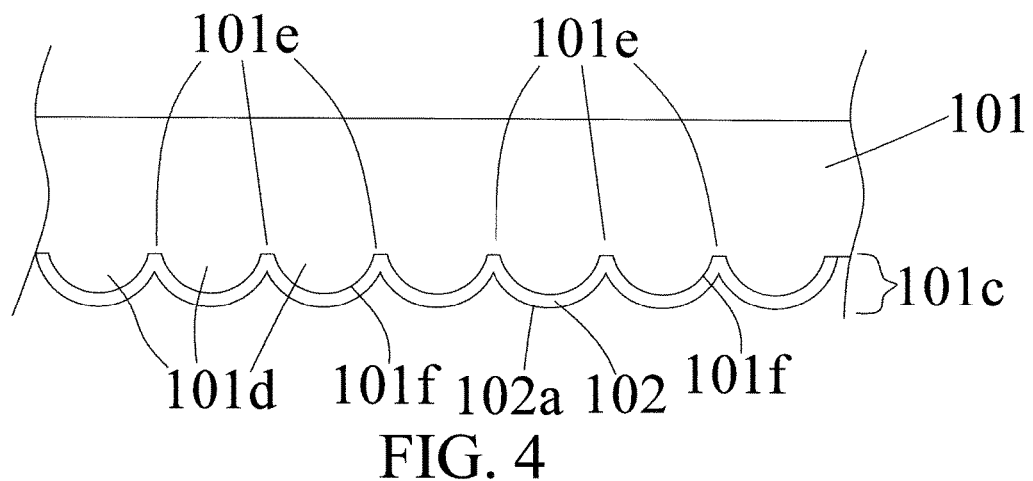
FIG. 4 is a schematic view of a semiconductor device with a high absorption structure in a dome shape in accordance with some embodiments of the present disclosure.
Figure 5:
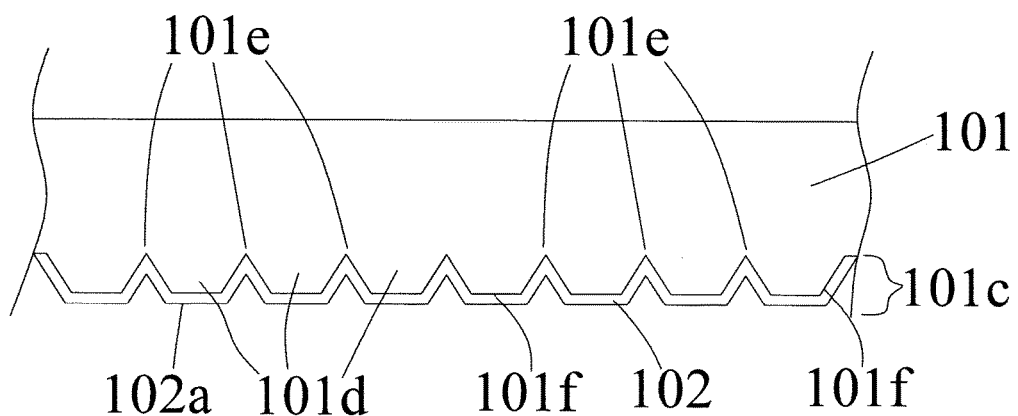
FIG. 5 is a schematic view of a semiconductor device with a high absorption structure in a cylindrical shape in accordance with some embodiments of the present disclosure.

A semiconductor device is manufactured by a number of operations. During the manufacturing, a substrate is fabricated for absorbing and sensing electromagnetic radiation projected into the semiconductor device. The surface of the substrate is roughened and becomes a high absorption layer to increase performance on the absorption of the electromagnetic radiation and sensitivity of the semiconductor device. The high absorption layer can be fabricated by various operations such as photolithography, etching or laser treatment. The high absorption layer can refract and absorb the electromagnetic radiation incident on the substrate.

In order to increase quantum efficiency of the semiconductor device, the substrate is thinned down and then doped with suitable dopants (e.g. boron, gallium, etc.) over the high absorption layer by ion implantation operations. Subsequently, laser annealing operations are performed to activate the implanted dopants as well as repair crystal defects caused during the ion implantation operations. However, the laser annealing operations have a limitation on a depth. It cannot activate the dopants disposed in a depth greater than about 0.2 um. As a result, the laser annealing operations could not fully cover the depth of the high absorption layer and some of dopants cannot be activated, which would affect the performance of the semiconductor device.

A full well capacity (FWC) is a performance index indicating a dynamic range of the semiconductor image sensing device. The FWC is an amount of charge that an individual pixel of the image sensing device can store before saturation. Greater FWC means a higher dynamic range and better signal to noise ratio. Since the laser annealing operations cannot fully activate the dopants on the high absorption layer, the charges capable to be stored by each pixel would be lesser and thus the FWC would then be smaller.

As such, there is a continuous need to improve the structure and the manufacturing operations of the semiconductor image sensing device in order to improve the performance of the semiconductor device particularly in aspects of quantum efficiency, FWC and/or absorption of electromagnetic radiation.

In the present disclosure, a semiconductor device with an improved configuration and operations are disclosed. The semiconductor device includes a substrate. The substrate includes a high absorption structure over a back side of the substrate. The high absorption structure is formed by photolithography operations and etching operations. A dielectric layer with a high dielectric constant (high k) material is disposed over the high absorption structure. The dielectric layer provides a continuous active layer over the back side of the substrate. The continuous layer of the dielectric layer over the high absorption structure could enhance quantum efficiency and increase FWC of the semiconductor device.

Further, the deposition of the dielectric layer over the high absorption structure could omit the subsequent ion implantation operations and laser annealing operations. As a result, manufacturing cost and time on the semiconductor device could be reduced and minimized. In addition, as the ion implantation operations and the laser annealing operations are omitted, the substrate would not be damaged by these operations. Therefore, the deposition of the dielectric layer could avoid damages to the substrate.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a semiconductor device 100 in accordance with various embodiments of the present disclosure. The semiconductor device 100 includes a substrate 101 and a dielectric layer 102. The dielectric layer 102 is disposed over the substrate 101.

In some embodiments, the substrate 101 includes silicon, ceramic or etc. In some embodiments, the substrate 101 includes group III, group IV, and/or group V elements, such as silicon, germanium, gallium, arsenic, and combinations thereof.

In some embodiments, the substrate 101 is a silicon substrate. In some embodiments, the substrate 101 is in a form of silicon-on-insulator (SOI). The SOI substrate includes a layer of a semiconductor material (e.g., silicon, germanium and/or the like) disposed over an insulator layer (e.g., buried oxide and/or the like). In some embodiments, the substrate 101 is in a form of multi-layered substrates, gradient substrates, hybrid orientation substrates, any combinations thereof and/or the like.

The substrate 101 may further comprise a variety of electrical circuits (not shown). The electrical circuits formed over the substrate 101 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

The substrate 101 includes a front side 101*a* and a back side 101*b*. In some embodiments, the back side 101*b* is opposite to the front side 101*a*. In some embodiments, the front side 101 is configured to dispose several devices such as image sensing device, pixel device, photo-diode or any other devices in accordance with functions of the semiconductor device. In some embodiments, an electromagnetic radiation is incident to the back side 101*b* of the substrate 101.

The substrate 101 also includes a high absorption structure 101*c* disposed over the back side 101*b* of the substrate 101. In some embodiments, the high absorption structure 101c is configured to absorb an electromagnetic radiation in a predetermined wavelength. In some embodiments, the high absorption structure 101c includes silicon. In some embodiments, the high absorption structure 101c is a high absorption silicon.

In some embodiments, the electromagnetic radiation is incident to the high absorption structure 101c. In some embodiments, the high absorption structure 101c is configured to absorb the electromagnetic radiation and generate an electrical energy in response to the absorption of the electromagnetic radiation. In some embodiments, the electromagnetic radiation has the predetermined wavelength of about 200 nm to about 3000 nm. In some embodiments, the predetermined wavelength of the electromagnetic radiation is about 400 nm to 700 nm. In some embodiments, the high absorption structure 101c is configured to absorb a visible light or an infrared (IR).

In some embodiments, the electromagnetic radiation is projected on the high absorption structure 101c and then absorbed by the high absorption structure 101c. The electrical energy is generated in accordance with an intensity or brightness of the electromagnetic radiation. In some embodiments, the electrical energy transmits to a circuitry in the substrate 101, so that the electromagnetic radiation is detected for subsequent operations such as image capturing, reformation of image or etc.

In some embodiments, the high absorption structure 101c includes several protrusions 101d protruding from the back side 101b of the substrate 101. In some embodiments, the high absorption structure 101c includes several recesses 101e indented towards the front side 101a of the substrate 101. In some embodiments, each of the protrusions 101d or each of the recesses 101e has a height H of about 0.1 um to about 1 um. In some embodiments, the height H of each protrusion 101d is about 0.2 to about 0.6 um.

In some embodiments, each protrusion 101d is extended upright from the back side 101b of the substrate 101. Each protrusion 101d is substantially orthogonal to the front side 101a or the back side 101b of the substrate 101. In some embodiments, the protrusions 101d (or the recesses 101e) are consistently spaced from each other. In some embodiments, the protrusions 101d (or the recesses 101e) are in substantially same size, dimension and shape from each other.

Figure 6:
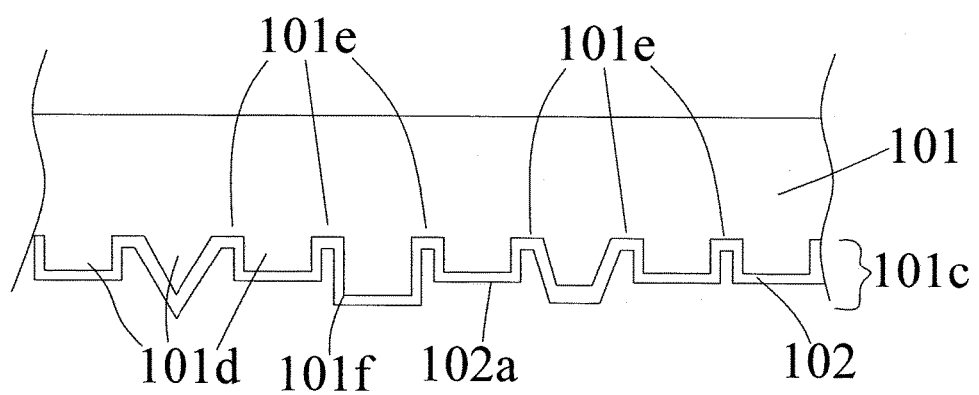
FIG. 6 is a schematic view of a semiconductor device with a high absorption structure in a combination of various shapes in accordance with some embodiments of the present disclosure.

In some embodiments, the protrusion 101d (or the recess 101e) is in a substantially conical or cylindrical shape. In some embodiments, the protrusion 101d (or the recess 101e) is in various shapes as shown in FIGS. 2-5 such as rectangular, dome, finger shapes. In some embodiments, the protrusions 101d (or the recesses 101e) are in combination of various shapes as shown in FIG. 6.

Referring back to FIG. 1, the semiconductor device 100 includes the dielectric layer 102. The dielectric layer 102 includes a high dielectric constant (high k) dielectric material. In some embodiments, the dielectric layer 102 is disposed on the high absorption structure 101c of the substrate 101. In some embodiments, the dielectric layer 102 is disposed conformal to the high absorption structure 101c. The dielectric layer is disposed along an outer surface of the high absorption structure 101c.

In some embodiments, the high absorption structure 101c includes a continuous surface 101f. The continuous surface 101f is across the back side 101b and includes several outer surfaces 101f of the high absorption structure 101c. In some embodiments, the continuous surface 101f includes several outer surfaces 101f of the protrusions 101d or the recesses 101e. In some embodiments, the dielectric layer 102 is disposed along the continuous surface 101f.

In some embodiments, the high absorption structure 101c includes a first continuous surface 101f, and the dielectric layer 102 includes a second continuous surface 102a. In some embodiments, the first continuous surface 101f is substantially same profile and/or shape as the second continuous surface 102a, as shown in FIGS. 1-6. In some embodiments, the dielectric layer 102 is in a ripple or wavy shape.

In some embodiments, the high absorption structure 101c and the dielectric layer 102 are configured to absorb the electromagnetic radiation and generate an electrical energy in response to the absorption of the electromagnetic radiation. In some embodiments, the high absorption structure 101c and the dielectric layer 102 can absorb visible light or IR in order to generate electrical charges.

Since the dielectric layer 102 is disposed conformal to the high absorption structure 101c, a continuous active layer of the dielectric layer 102 is disposed on the high absorption structure 101c. Such a continuous active layer of the dielectric layer 102 can enhance the quantum efficiency and the FWC of the semiconductor device 100. Further, absorption of the electromagnetic radiation by the semiconductor device 100 is improved by the disposition of the dielectric layer 102 on the high absorption structure 101c. As such, a sensitivity of the semiconductor device 100 is improved. In addition, subsequent ion implantation operations and/or laser annealing operations are not required to activate the high absorption structure 101c and thus manufacturing cost and time could be saved. Also, the disposition of the dielectric layer 102 would not cause any damages on the high absorption structure 101c or the substrate 101.

In some embodiments, the dielectric layer 102 has a high dielectric constant (high k) value. In some embodiments, the dielectric constant (k) of the dielectric layer 102 is greater than about 6. In some embodiments, the dielectric constant (k) of the dielectric layer 102 is in a range of about 10 to about 60. In some embodiments, the dielectric layer 102 includes one or more of high k dielectric materials. In some embodiments, the dielectric layer 102 includes Tantalum pentoxide ($Ta_2O_5$), Titanium dioxide ($TiO_2$), Hafnium oxide ($HfO_2$), Zirconium dioxide ($ZrO_2$), Aluminum oxide ($Al_2O_3$), Lanthanum oxide ($La_2O_3$), Praseodymium Oxide ($Pr_2O_3$) or Yttrium oxide ($Y_2O_3$). In some embodiments, the dielectric layer 102 has a thickness of about 0.0001 um to about 10 um.

Figure 7:
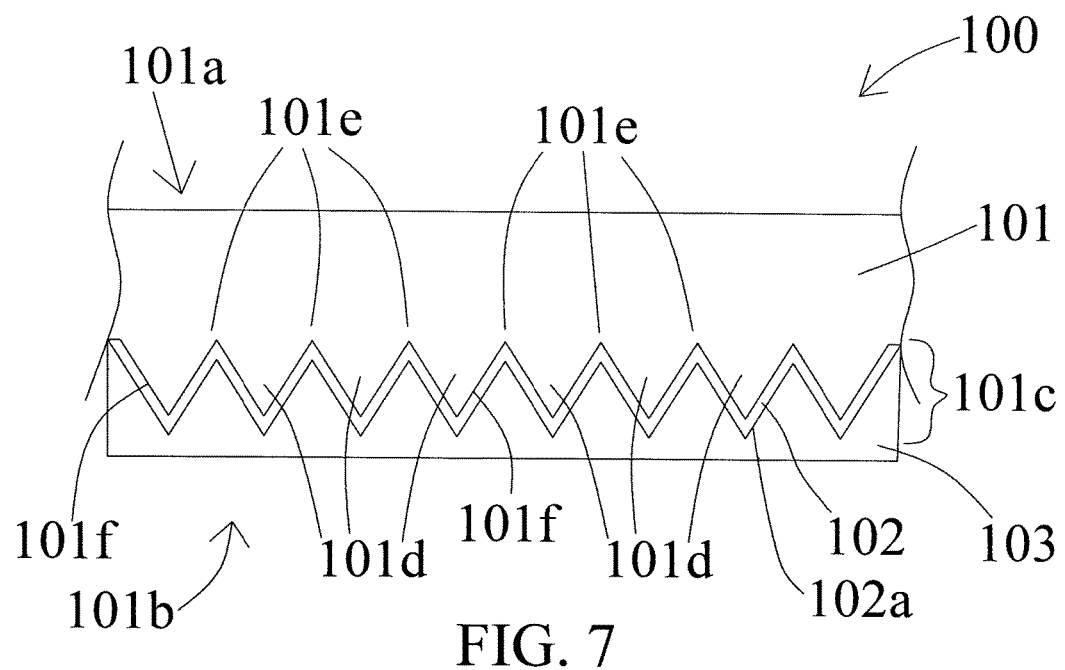
FIG. 7 is a schematic view of a semiconductor device with an oxide layer in accordance with some embodiments of the present disclosure.

In some embodiments as shown in FIG. 7, the semiconductor device 100 further includes an oxide layer 103 disposed over the dielectric layer 102. In some embodiments, the dielectric layer 102 is disposed between the high absorption structure 101c and the oxide layer 103. In some embodiments, the oxide layer 103 includes silicon oxide. In some embodiments, the oxide layer 103 is disposed conformal to the second continuous surface 102a of the dielectric layer 102.

Figure 8:
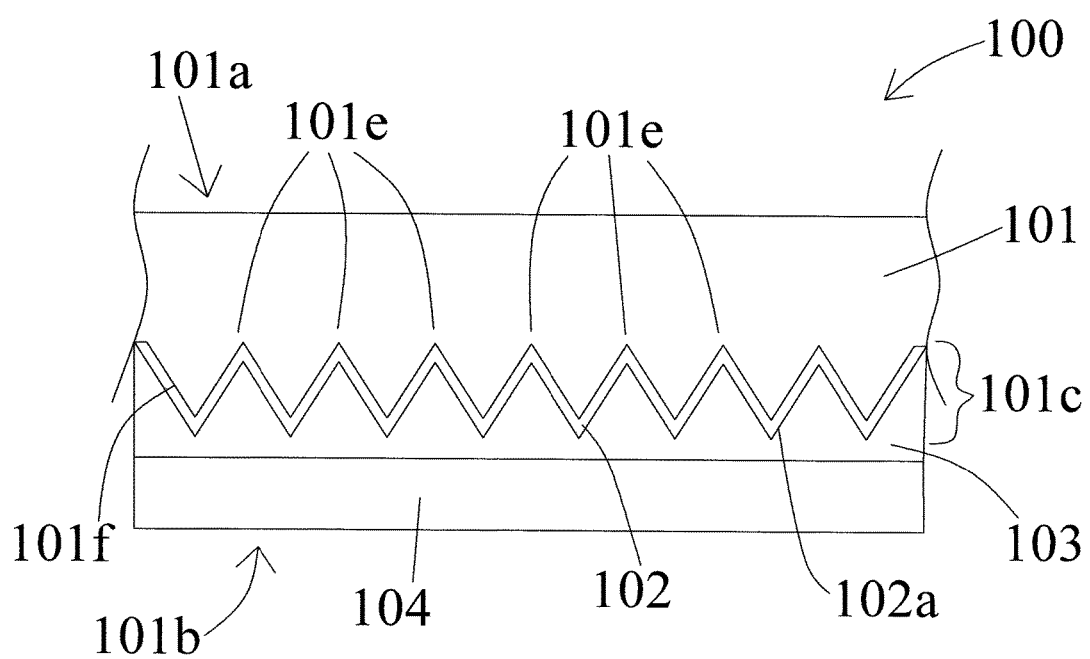
FIG. 8 is a schematic view of a semiconductor device with a passivation in accordance with some embodiments of the present disclosure.

In some embodiments as shown in FIG. 8, the semiconductor device 100 further includes a passivation layer 104 disposed over the dielectric layer 102. In some embodiments, the dielectric layer 102 is disposed between the high absorption structure 101c of the substrate 101 and the passivation layer 104. In some embodiments, the passivation layer 104 is disposed on the oxide layer 103. In some embodiments, the passivation layer 104 includes dielectric material such as silicon nitride.

Figure 9:
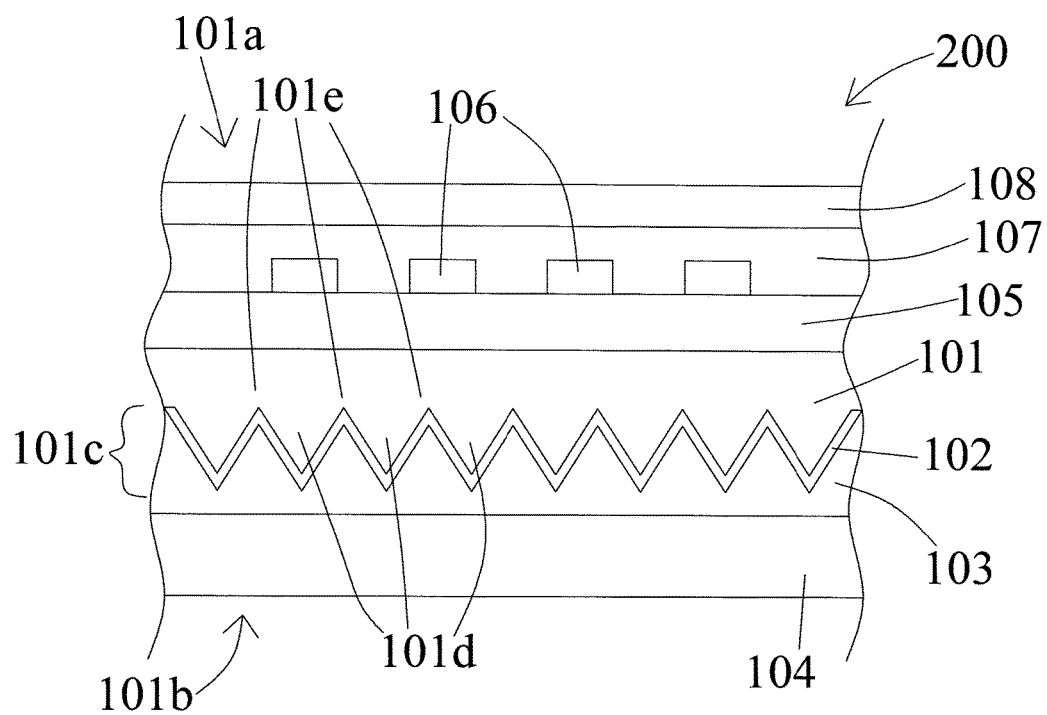
FIG. 9 is a schematic view of a semiconductor device with several pixel devices in accordance with some embodiments of the present disclosure.

FIG. 9 is a semiconductor device 200 in accordance with various embodiments of the present disclosure. The semiconductor device 200 includes a substrate 101 with a front side 101a and a back side 101b, a high absorption structure 101c, a dielectric layer 102, a first oxide layer 103 and a first passivation 104 which are in similar configurations as in FIGS. 1-8.

In some embodiments, the substrate 101 includes the front side 101a, the back side 101b opposite to the front side 101a, and several recesses 101e at the back side 101b of the substrate 101. In some embodiments, the substrate 101 includes several protrusions 101d protruding from the back side 101b of the substrate 101. In some embodiments, each recess 101e or each protrusion 101d is in a substantially conical, cylindrical or any other shapes.

In some embodiments, the dielectric layer 102 is a high k dielectric film disposed over and conformal to the recesses 101e or the protrusions 101d. In some embodiments, the first oxide layer 103 is disposed over the high k dielectric film. In some embodiments, the high k dielectric film is disposed between the recesses 101e and the first oxide layer 103.

In some embodiments, an epitaxial layer 105 is disposed at the front side 101a of the substrate 101. In some embodiments, the epitaxial layer 105 is a thin crystalline layer of silicon. The epitaxial layer 105 is used for disposing several layers of silicon on the substrate 101. In some embodiments, the epitaxial layer 105 includes transistors, capacitors or the like.

In some embodiments, a p-type photo active region and an n-type photo active region functioned as a photo-diode are formed in the epitaxial layer 105. In some embodiments, the photo-diode is configured to generate a signal related to an intensity or brightness of an electromagnetic radiation incident to the high absorption structure 101c or the back side 101b of the substrate 101.

In some embodiments, the semiconductor device 200 includes a pixel device 106 disposed on the front side 101a of the substrate 101. In some embodiments, the pixel device 106 includes a transistor such as transfer transistor, reset transistor, source follower transistor, select transistor, etc. In some embodiments, the transistor includes a gate dielectric and a gate electrode which are patterned on the front side 101a of the substrate 101. The gate dielectric is adjacent to the substrate 101, and the gate electrode is disposed over the gate dielectric. In some embodiments, a spacer is disposed along a sidewall of the gate dielectric and the gate electrode.

In some embodiments, the pixel device 106 is surrounded by a second passivation 107. In some embodiments, the second passivation 107 includes dielectric material such as spin-on glass (SOG), silicon oxide, silicon oxynitride, silicon nitride or the like. In some embodiments, the first passivation 104 and the second passivation 107 include same or different materials.

In some embodiments, the semiconductor device 200 includes a second oxide layer 108 disposed on the second passivation 107. In some embodiments, the second oxide layer 108 is configured to protect the pixel device 106 and the substrate 101 underlaid from damages. In some embodiments, the second oxide layer 108 includes silicon oxide or the like. In some embodiments, the first oxide layer 103 and the second oxide layer 108 include same or different materials.

In the present disclosure, a method of manufacturing a semiconductor device is also disclosed. In some embodiments, a semiconductor device is formed by a method 300. The method 300 includes a number of operations and the description and illustration are not deemed as a limitation as the sequence of the operations.

Figure 10:
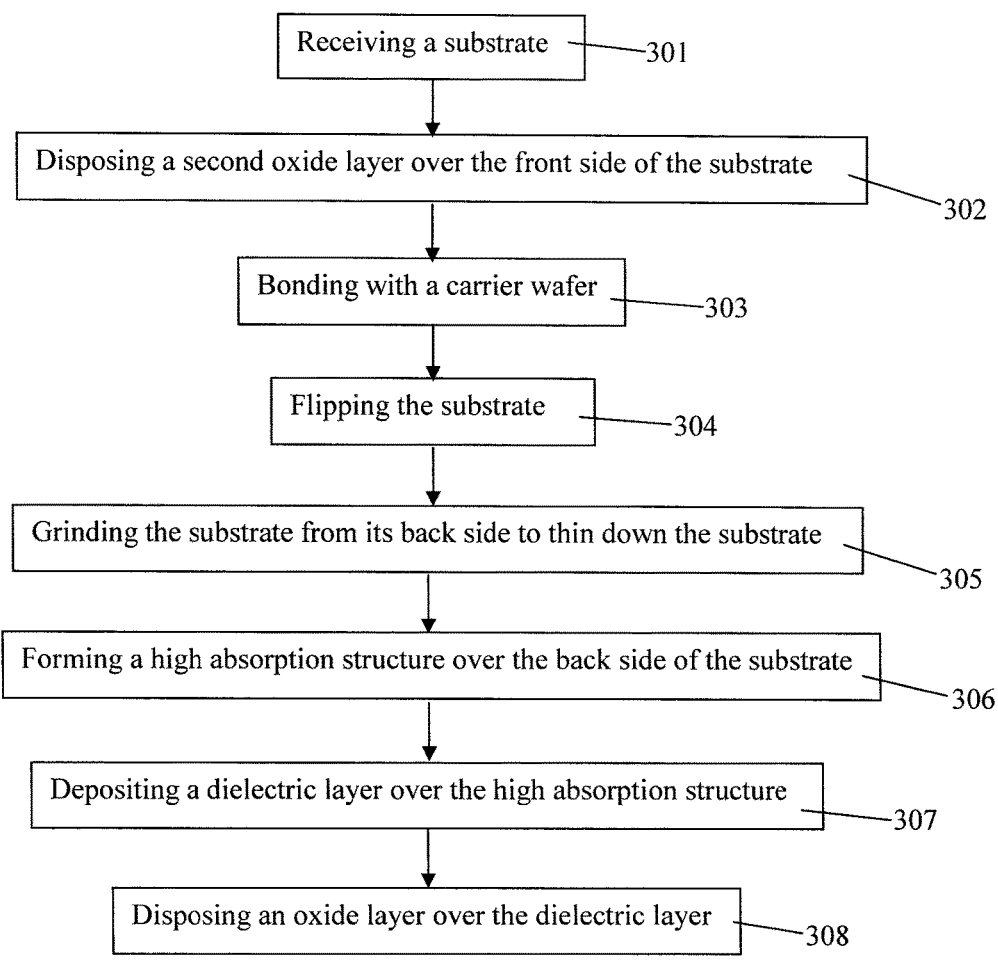
FIG. 10 is a flow diagram of a method of manufacturing a semiconductor device in accordance with some embodiments of the present disclosure.

FIG. 10 is a diagram of a method 300 of manufacturing a semiconductor device in accordance with various embodiments of the present disclosure. The method 300 includes a number of operations (301, 302, 303, 304, 305, 306, 307 and 308).

Figure 11:
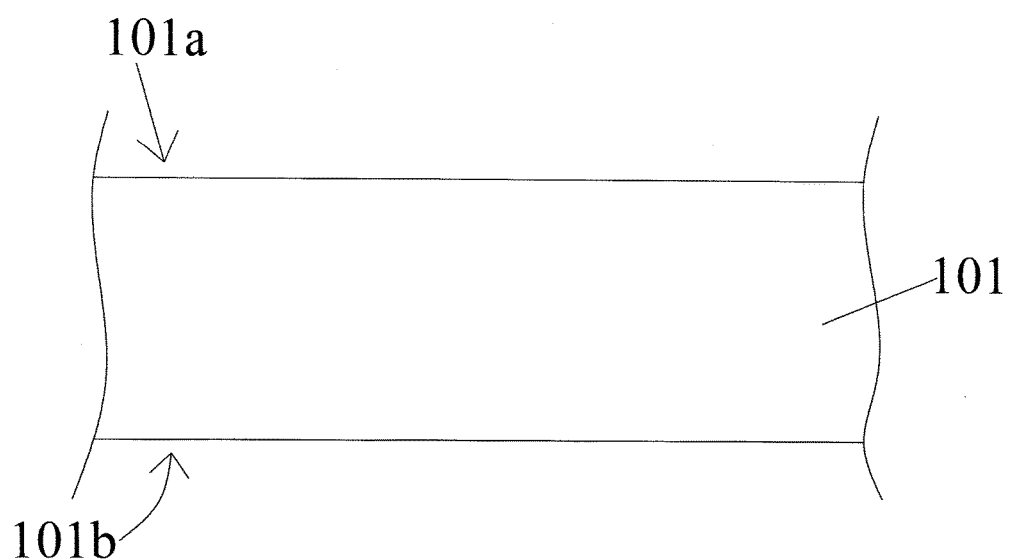
FIG. 11 is a schematic view of a substrate in accordance with some embodiments of the present disclosure.

In operation 301, a substrate 101 is received or provided as in FIG. 11. In some embodiments, the substrate 101 is formed by a semiconductor material such as silicon, germanium, or the like. In some embodiments, the substrate 101 is produced from crystal form of silicon through numbers of operations. In some embodiments, the substrate 101 is a silicon substrate.

In some embodiments, the substrate 101 includes a front side 101a and a back side 101b opposite to the front side 101a. In some embodiments, the substrate 101 has similar configuration as the substrate 101 in any one of FIGS. 1-9.

Figure 12:
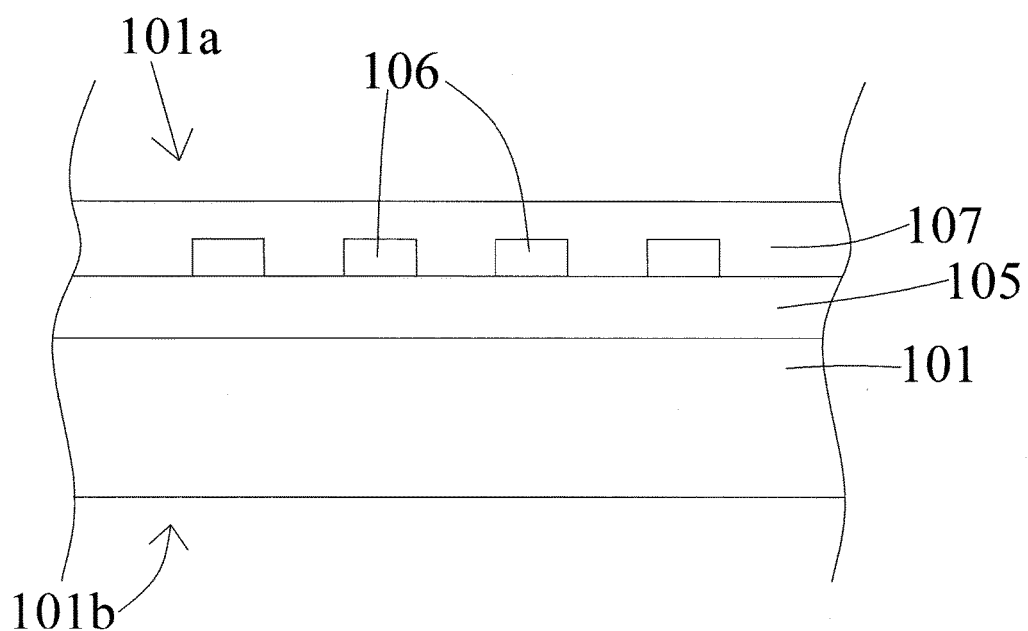
FIG. 12 is a schematic view of a substrate with several pixel devices in accordance with some embodiments of the present disclosure.

In some embodiments, the substrate 101 with an epitaxial layer 105 formed thereon is received or provided as in FIG. 12. In some embodiments, the epitaxial layer 105 is disposed on the front side 101a of the substrate 101. In some embodiments, the epitaxial layer 105 is a thin crystalline layer of silicon. The epitaxial layer 105 is used for disposing several layers of silicon on the substrate 101. In some embodiments, the epitaxial layer 105 is formed by an epitaxy operation, that a crystal or a crystalline film of silicon in a particular orientation is grown on the substrate 101. In some embodiments, the epitaxial layer 105 is manufactured by a chemical vapor deposition (CVD). In some embodiments, the epitaxial layer 105 has similar configuration as in FIG. 9.

In some embodiments, the substrate 101 with several pixel devices 106 formed thereon is received or provided as in FIG. 12. The pixel devices 106 such as transistors, photo-diode, etc. are patterned and formed at the front side 101a of the substrate 101. In some embodiments, the pixel devices 106 are surrounded by a second passivation 107 to protect and isolate the pixel devices 106 from each other. In some embodiments, the second passivation 107 is disposed by any suitable methods such as CVD or the like. In some embodiments, the pixel devices 106 and the second passivation 107 have similar configurations as in FIG. 9.

Figure 13:
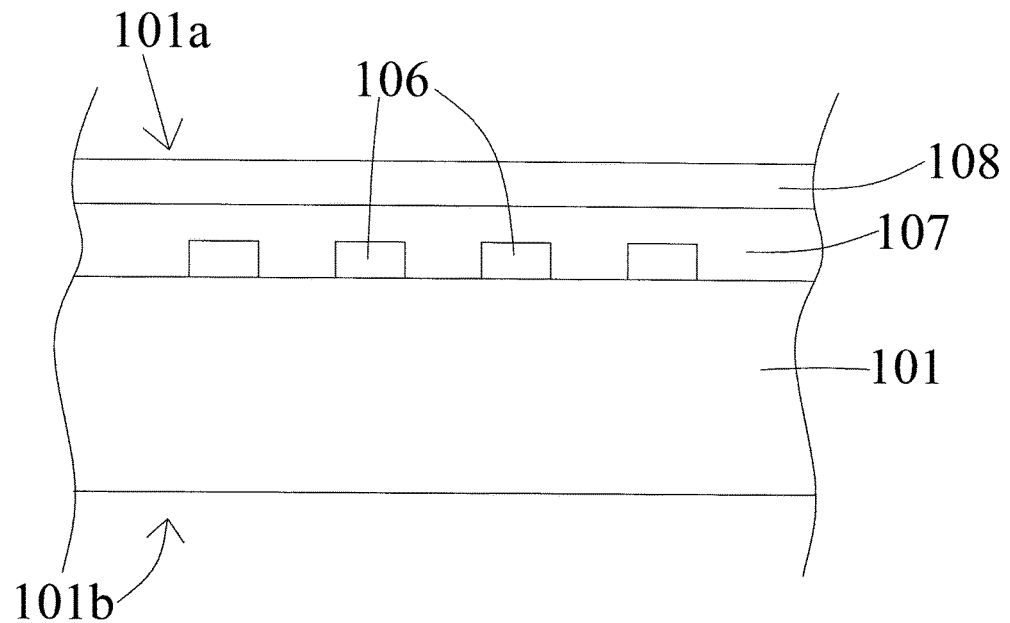
FIG. 13 is a schematic view of a substrate with an oxide layer over several pixel devices in accordance with some embodiments of the present disclosure.

In operation 302, a second oxide layer 108 is disposed over the front side 101a of the substrate 101 as shown in FIG. 13. In some embodiments, the second oxide layer 108 is disposed on the second passivation 107. In some embodiments, the second oxide layer 108 is formed by any suitable operations such as thermal oxidation, CVD, etc. In some embodiments, the second oxide layer 108 has similar configuration as in FIG. 9.

Figure 14:
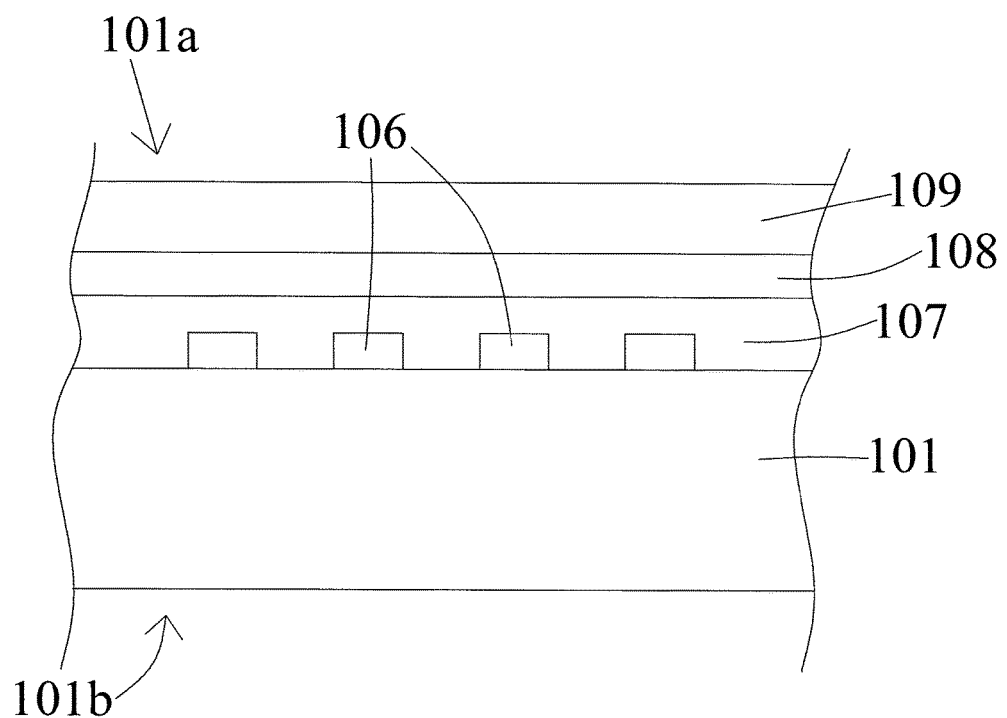
FIG. 14 is a schematic view of a substrate bonded with a carrier wafer in accordance with some embodiments of the present disclosure.

In operation 303, a carrier wafer 109 is bonded with the substrate 101 at the front side 101a as shown in FIG. 14. In some embodiments, the carrier wafer 109 is a silicon or glass wafer. In some embodiments, the carrier wafer 109 is bonded with the substrate 101 by any suitable operations such as oxide-to-oxide fusion bonding, adhesive bonding, vacuum bonding, anodic bonding or the like. In some embodiments, the second oxide layer 108 of the substrate 101 is bonded with an oxide layer of the carrier wafer 109. The carrier wafer 109 provides mechanical support to resist forces due to subsequent operations such as grinding operations.

Figure 15:
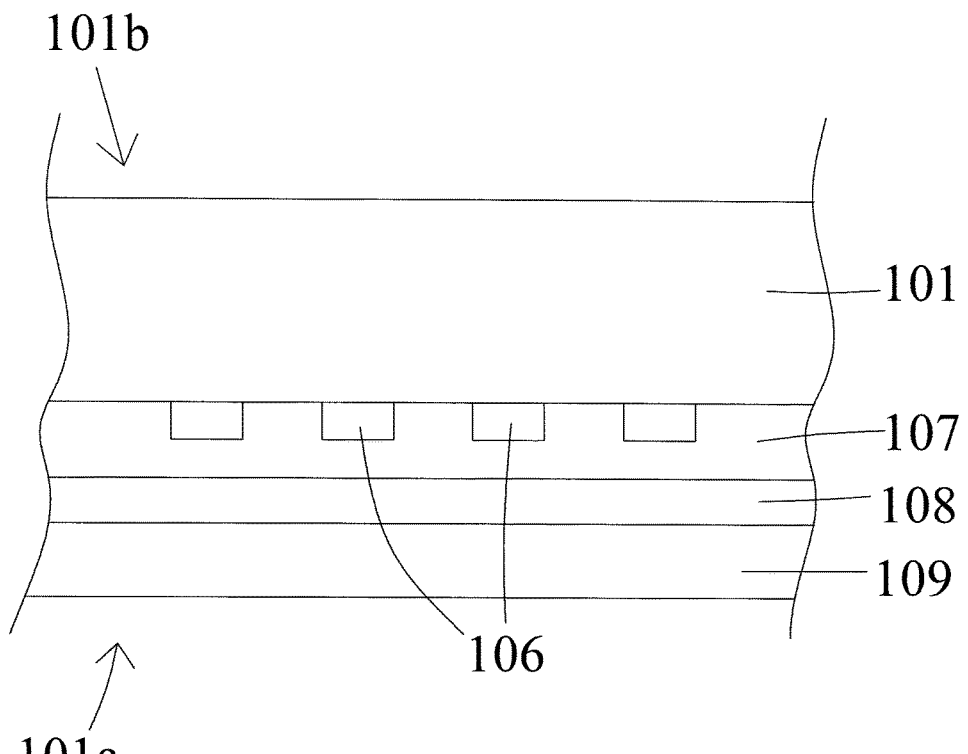
FIG. 15 is a schematic view of a substrate with its back side facing upward in accordance with some embodiments of the present disclosure.

In operation 304, the substrate 101 is flipped as shown in FIG. 15. After flipping the substrate 101, the back side 101b of the substrate 101 is faced upward while the front side 101a of the substrate 101 is faced downward. The carrier wafer 109 is disposed at a bottom while the substrate 101 is disposed at a top. The flipping of the substrate 101 facilitates subsequent operations on the back side 101b of the substrate 101. In some embodiments, the flipping is performed by any suitable toolings such as clamp, gripper or etc.

Figure 16:
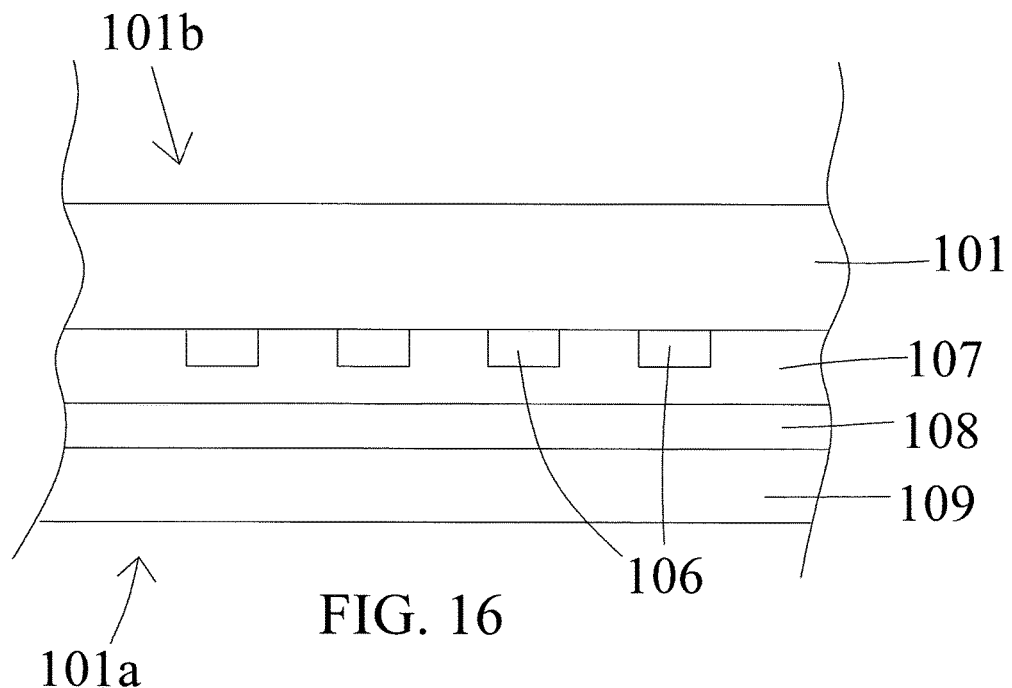
FIG. 16 is a schematic view of a thinned substrate in accordance with some embodiments of the present disclosure.

In operation 305, the substrate 101 is ground from the back side 101b to thin down the substrate 101 as shown in FIG. 16. In some embodiments, an overall thickness of the substrate 101 is decreased by the back side grinding operations. In some embodiments, the substrate 101 is thinned down by other suitable operations such as etching, polishing, chemical mechanical polishing (CMP) or etc.

In some embodiments, the substrate 101 is ground from the back side 101b until the overall thickness of the substrate 101 is smaller than about 5 um. In some embodiments, the overall thickness of the substrate 101 is thinned down to less than about 2 um. Such a thinned substrate 101 facilitates an electromagnetic radiation incident to the back side 101b can effectively reach the pixel device 106 or photo-diode formed on or within the substrate 101.

Figure 17:
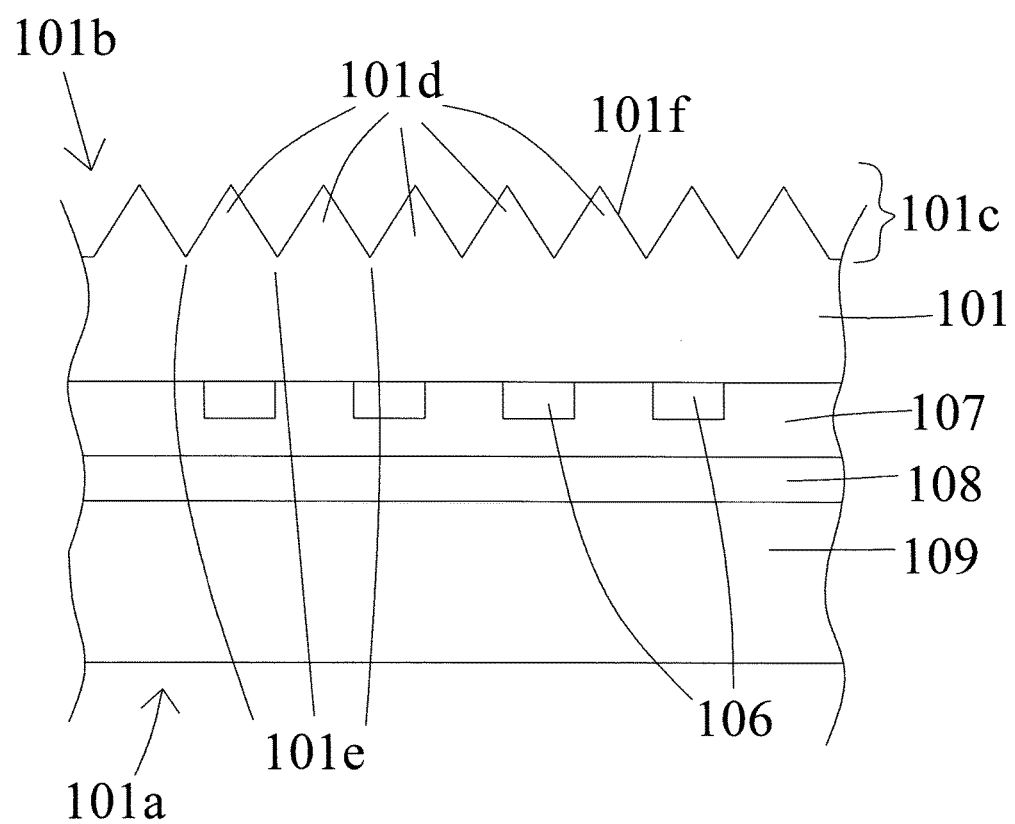
FIG. 17 is a schematic view of a substrate with a high absorption structure in accordance with some embodiments of the present disclosure.

In operation 306, a high absorption structure 101c is formed over the back side 101b of the substrate 101 as shown in FIG. 17. In some embodiments, the high absorption structure 101c is formed by photolithograph operations and etching operations. In some embodiments, the high absorption structure 101c includes several protrusions 101d or several recesses 101e which are formed by photolithograph operations and etching operations.

The protrusions 101d or the recesses 101e are formed at the back side 101b of the substrate 101. In some embodiments, the high absorption structure 101c includes a first continuous surface 101f. The first continuous surface 101f includes several outer surfaces of the protrusions 101d or the recesses 101e. In some embodiments, the high absorption structure 101c, the protrusions 101d and the recesses 101e have similar configurations as in FIGS. 1-9.

The high absorption structure 101c can absorb an electromagnetic radiation of a predetermined wavelength. In some embodiments, the electromagnetic radiation such as visible light or infrared (IR) is projected on and then absorbed by the high absorption structure 101c. In some embodiments, an electrical signal is generated or induced by the pixel device 106 in accordance with intensity or brightness of the electromagnetic radiation projected on the high absorption structure 101c. The electrical signal is transmitted to circuitry formed within the substrate 101.

In some embodiments, a photoresist is disposed and temporarily coated on the back side 101b of the substrate 101. The photoresist is a light sensitive material with chemical properties depending on an exposure of light. The photoresist is sensitive to an electromagnetic radiation such as an ultra violet (UV) light, that the chemical properties of the photoresist is changed upon exposure to the UV light. In some embodiments, the photoresist is evenly disposed on the back side 101b of the substrate 101 by spin coating.

Further, an electromagnetic radiation such as UV light is projected on the photoresist 106 through the patterned photomask. The photoresist receives the UV light corresponding to the predetermined pattern of the photomask. The portions of the photoresist exposed to the UV light are dissolvable by a developer solution and the unexposed portions of the photoresist are not dissolvable by the developer solution. As a result, a photoresist with the predetermined pattern is disposed on the back side 101b of the substrate 101.

Some portions of the back side 101b of the substrate 101 without coverage of the photoresist are removed to form the high absorption structure 101c including several recesses 101e or several protrusions 101d as shown in FIG. 17. In some embodiments, those uncovered portions are removed by a suitable etching operation such as plasma etching, an anisotropic dry etching, a reactive ion etching (RIE), a dry etching or etc.

In addition, the photoresist is removed from the back side 101b of the substrate 101 after the formation of the high absorption structure 101c. The photoresist is removed by suitable photoresist stripping techniques, such as chemical solvent cleaning, plasma ashing, dry stripping and/or the like.

Figure 18:
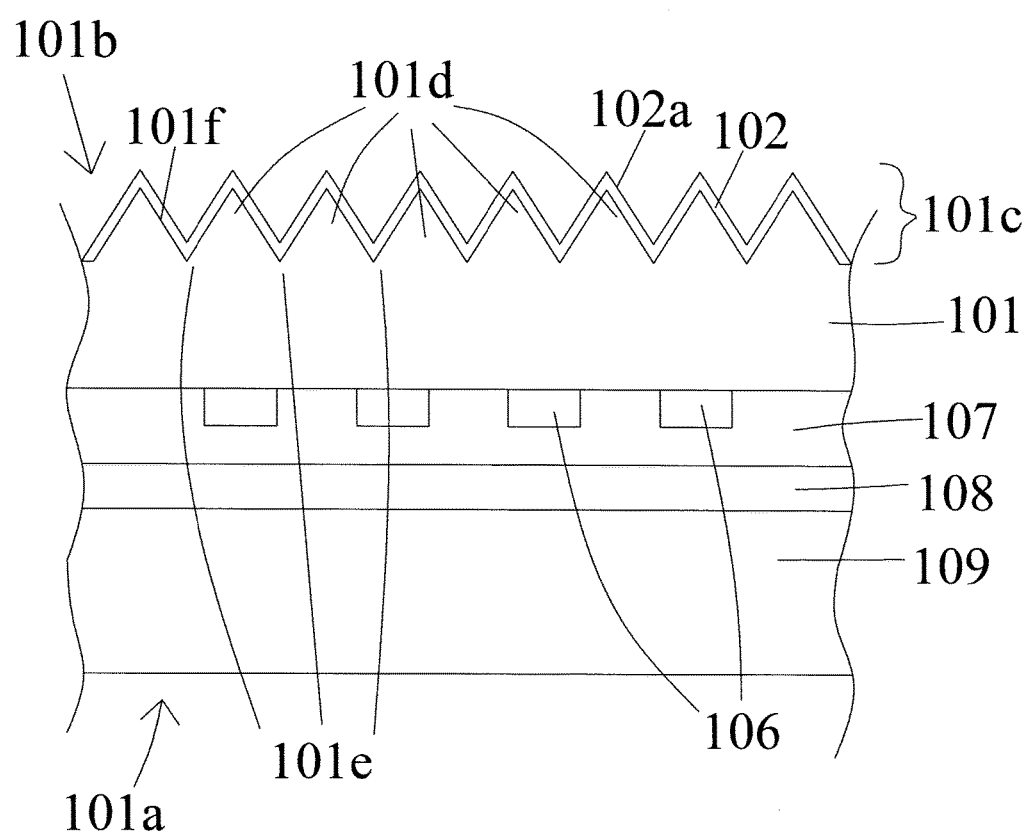
FIG. 18 is a schematic view of a substrate with a dielectric layer disposed on a high absorption structure in accordance with some embodiments of the present disclosure.

In operation 307, a dielectric layer 102 is deposited over the high absorption structure 101c as shown in FIG. 18. The dielectric layer 102 is disposed conformal to the high absorption structure 101c. The dielectric layer 102 is conformal to the protrusions 101d or the recesses 101e of the substrate 101. In some embodiments, a semiconductor device of FIG. 18 has similar configuration as the semiconductor device 100 of FIG. 1

In some embodiments, the dielectric layer 102 is disposed along the first continuous surface 101f of the high absorption structure 101c of the substrate 101. In some embodiments, the dielectric layer 102 is deposited by forming a continuous layer of the dielectric layer 102 along the first continuous surface of the high absorption structure 101c. In some embodiments, the dielectric layer 102 includes a second continuous surface 102a over the first continuous surface 101f. In some embodiments, the first continuous surface 101f has similar shape or profile as the second continuous surface 102a.

In some embodiments, the dielectric layer 102 includes a high k dielectric material. In some embodiments, the dielectric layer 102 includes Tantalum pentoxide ($Ta_2O_5$), Titanium dioxide ($TiO_2$), Hafnium oxide ($HfO_2$), Zirconium dioxide ($ZrO_2$), Aluminum oxide ($Al_2O_3$), Lanthanum oxide ($La_2O_3$), Praseodymium Oxide ($Pr_2O_3$) or Yttrium oxide ($Y_2O_3$). In some embodiments, the dielectric layer 102 is deposited by any suitable operations such as atomic layer deposition (ALD) operations.

Figure 19:
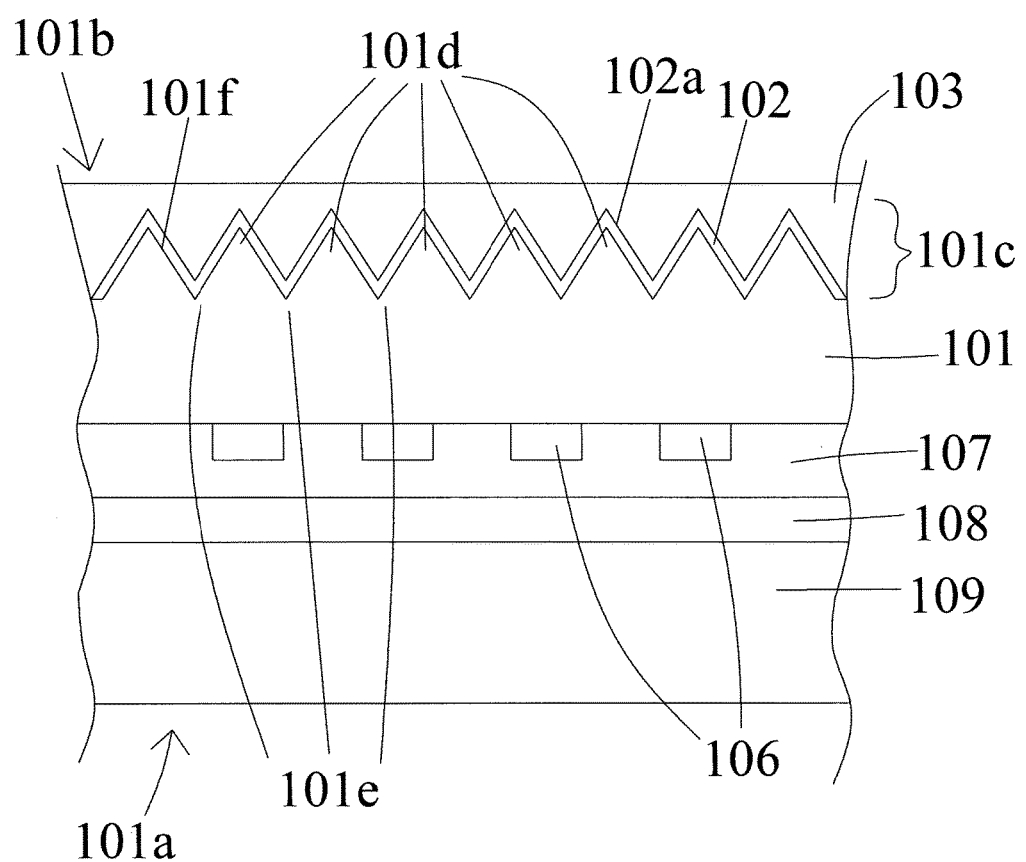
FIG. 19 is a schematic view of a substrate with an oxide layer disposed on a dielectric layer in accordance with some embodiments of the present disclosure.

In operation 308, a first oxide layer 103 is disposed over the high absorption structure 101c as shown in FIG. 19. In some embodiments, the first oxide layer 103 is disposed on the dielectric layer 102. In some embodiments, the first oxide layer 103 is disposed by any suitable operations such as such as thermal oxidation, CVD, etc. In some embodiments, the first oxide layer 103 includes material same as or different from the second oxide layer 108. In some embodiments, the first oxide layer 103 has similar configuration as in FIGS. 7-9. In some embodiments, a semiconductor device of FIG. 19 has similar configuration as the semiconductor device 100 of FIG. 7.

Figure 20:
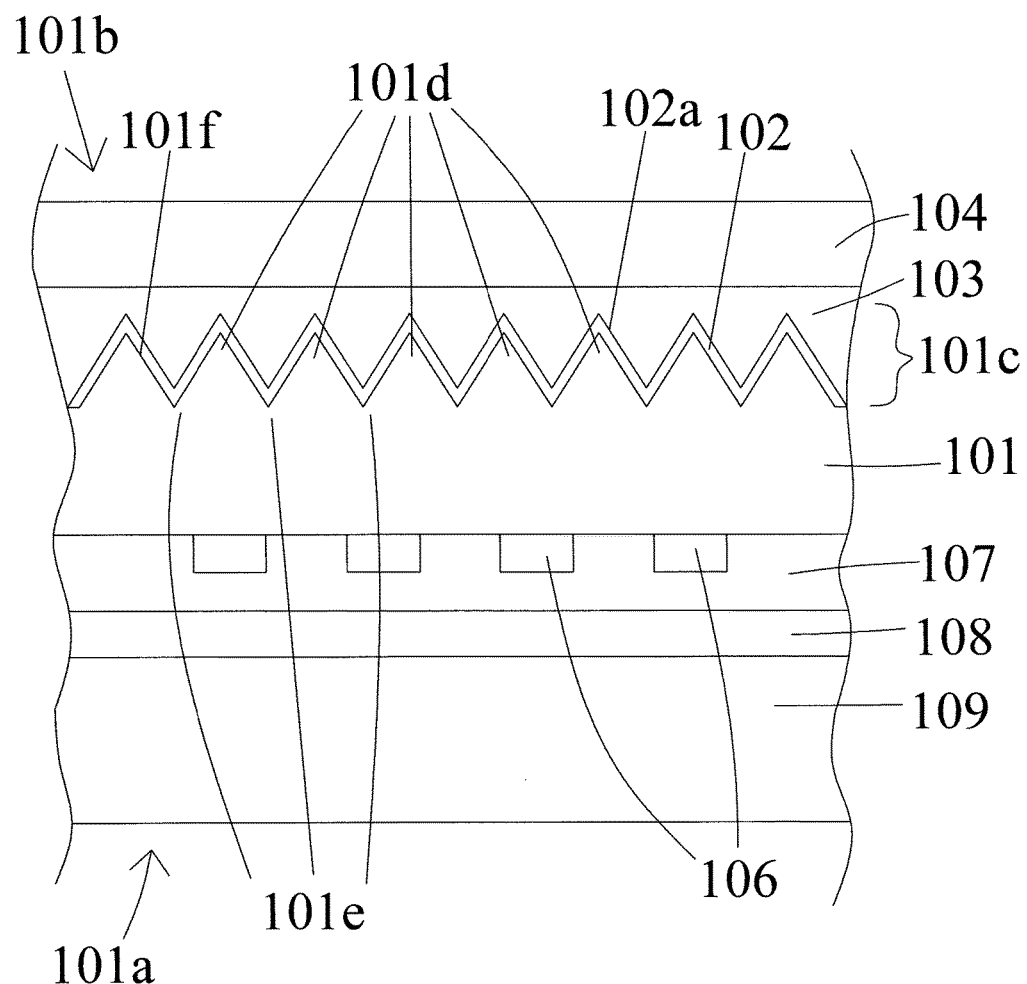
FIG. 20 is a schematic view of a substrate with a passivation disposed over a dielectric layer in accordance with some embodiments of the present disclosure.

In some embodiments, a first passivation 104 is disposed over the first oxide layer 103 as shown in FIG. 20. In some embodiments, the first passivation 104 includes material same as or different from the second passivation 107. In some embodiments, the first passivation 104 is disposed by any suitable methods such as CVD or the like. In some embodiments, a semiconductor device of FIG. 20 has similar configuration as the semiconductor device 100 of FIG. 8.

Figure 21:
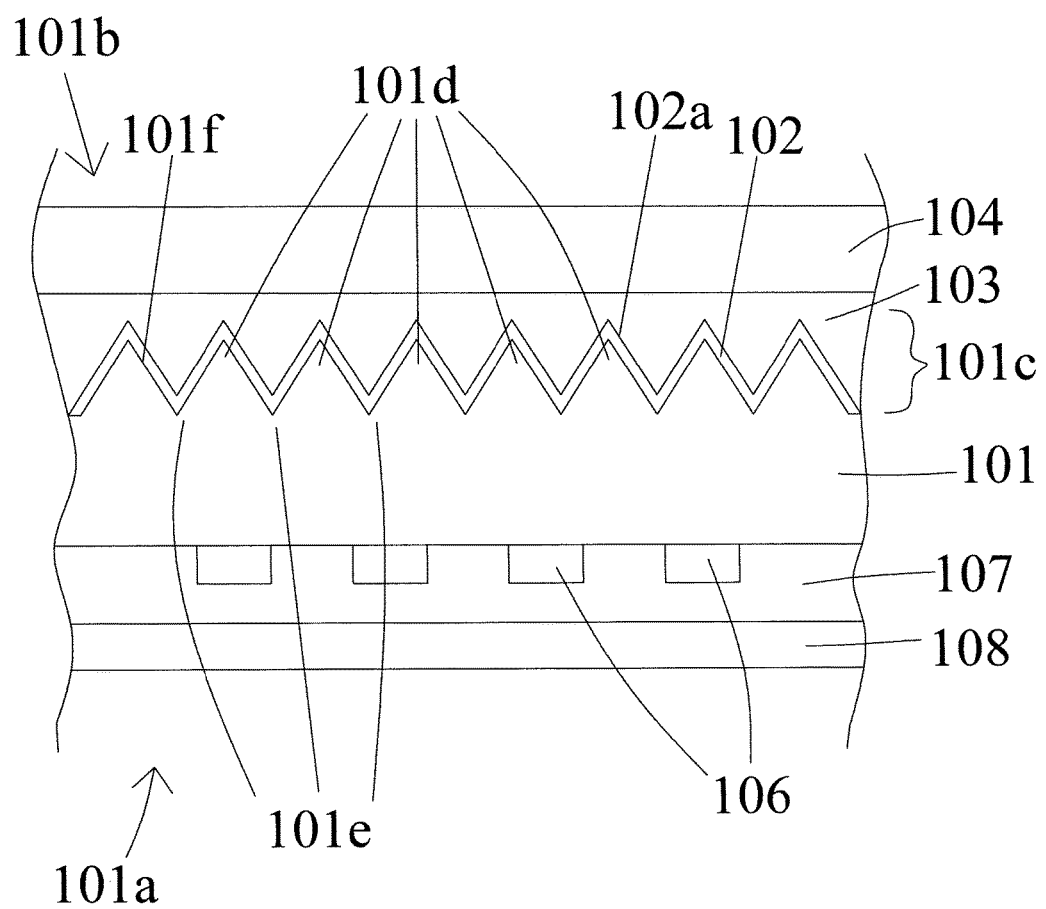
FIG. 21 is a schematic view of a substrate debonded from a carrier wafer in accordance with some embodiments of the present disclosure.

Further, the carrier wafer 109 is removed from the substrate 101 as shown in FIG. 21. In some embodiments, the carrier wafer 109 is debonded from the second oxide layer 108 after disposition of the dielectric layer 102, the first oxide layer 103 or the first passivation 104. In some embodiments, a semiconductor device of FIG. 21 has similar configuration as the semiconductor device 100 of FIG. 9.

The present invention provides a semiconductor device and a manufacturing method thereof. The semiconductor device includes a substrate with a high absorption structure and a dielectric layer with high k dielectric material on the high absorption structure. The deposition of the dielectric layer with high k dielectric material along the high absorption structure would form a continuous active layer without causing any crystal defects on the substrate. Thus, no subsequent ion implantations and laser annealing for activating the implanted ions and repairing the crystal defects are required, and therefore manufacturing cost and time could be saved. In addition, the continuous active layer formed by the dielectric layer with high k dielectric material would improve the quantum efficiency and the FWC of the semiconductor device.

In some embodiments, a semiconductor device includes a substrate including a front side, a back side opposite to the front side, and a high absorption structure disposed over the back side of the substrate and configured to absorb an electromagnetic radiation in a predetermined wavelength, and a dielectric layer including a high dielectric constant (high k) dielectric material, wherein the dielectric layer is disposed on the high absorption structure.

In some embodiments, the dielectric layer is disposed conformal to the high absorption structure of the substrate. In some embodiments, the high absorption structure includes a continuous surface, and the dielectric layer is disposed along the continuous surface. In some embodiments, the high absorption structure includes a first continuous surface, and the dielectric layer includes a second continuous surface, and the first continuous surface is substantially same profile and/or shape as the second continuous surface. In some embodiments, a dielectric constant (k) of the dielectric layer is greater than about 6 or is in a range of about 10 to about 60.

In some embodiments, the dielectric layer includes Tantalum pentoxide ($Ta_2O_5$), Titanium dioxide ($TiO_2$), Hafnium oxide ($HfO_2$), Zirconium dioxide ($ZrO_2$), Aluminum oxide ($Al_2O_3$), Lanthanum oxide ($La_2O_3$), Praseodymium Oxide ($Pr_2O_3$) or Yttrium oxide ($Y_2O_3$). the substrate and the high absorption structure include silicon. In some embodiments, the semiconductor device further includes an oxide layer disposed over the dielectric layer, thereby the dielectric layer is disposed between the high absorption structure and the oxide layer.

In some embodiments, the semiconductor device further includes a passivation layer disposed over the dielectric layer, thereby the dielectric layer is disposed between the high absorption structure and the passivation layer. In some embodiments, the high absorption structure and the dielectric layer are configured to absorb the electromagnetic radiation and generate an electrical energy in response to the absorption of the electromagnetic radiation.

In some embodiments, the high absorption structure includes a plurality of protrusions protruding from the back side of the substrate, or the high absorption structure includes a plurality of recesses indented towards the front side of the substrate. In some embodiments, a height of each of the plurality of protrusions or a height of each of the plurality of recesses is about 0.2 um to about 0.6 um.

In some embodiments, a semiconductor device includes a substrate including a front side, a back side opposite to the front side, and a plurality of recesses at the back side, a pixel device disposed on the front side and surrounded by a passivation, a high dielectric constant (high k) dielectric film disposed over and conformal to the plurality of recesses, and an oxide layer disposed over the high k dielectric film, wherein the high k dielectric film is disposed between the plurality of recesses and the oxide layer.

In some embodiments, each of the plurality of recesses is in a substantially conical or cylindrical shape. In some embodiments, a thickness of the high k dielectric film is about 0.0001 um to about 10 um.

In some embodiments, a method of manufacturing a semiconductor device includes receiving a substrate including a front side and a back side opposite to the front side, grinding the substrate from the back side to thin down the substrate, forming a high absorption structure over the back side, and depositing a dielectric layer including a high dielectric constant (high k) dielectric material over the high absorption structure, wherein the dielectric layer is disposed conformal to the high absorption structure.

In some embodiments, the depositing the dielectric layer includes forming a continuous layer of the dielectric layer along a continuous surface of the high absorption structure. In some embodiments, the method further includes disposing an oxide layer over the dielectric layer. In some embodiments, the depositing the dielectric layer includes atomic layer deposition (ALD) operations. In some embodiments, the forming the high absorption structure includes forming a plurality of recesses or forming a plurality of protrusions at the back side by photolithography operations and etching operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including a front side, a back side opposite to the front side, and a high absorption structure disposed over the back side of the substrate and configured to absorb an electromagnetic radiation in a predetermined wavelength;
a dielectric layer including a high dielectric constant (high k) dielectric material and disposed over the high absorption structure; and
an oxide layer disposed over the dielectric layer,
wherein the high absorption structure includes a plurality of first protrusions protruded from the back side of the substrate and a plurality of first recesses indented towards the front side of the substrate, the plurality of first protrusions and the plurality of first recesses are alternately disposed to form a rough surface, the plurality of first protrusions have various shapes and the plurality of first recesses have various shapes, the oxide layer includes a plurality of second protrusions protruded towards the front side of the substrate and a plurality of second recesses indented towards the back side of the substrate, the plurality of second protrusions are disposed within the plurality of first recesses respectively, the plurality of first protrusions are disposed within the plurality of second recesses respectively, the dielectric layer is disposed along surfaces of each of the plurality of first protrusions, surfaces of each of the plurality of first recesses, surfaces of each of the plurality of second protrusions and surfaces of each of the plurality of second recesses, the dielectric layer includes Hafnium oxide ($HfO_2$), Praseodymium Oxide ($Pr_2O_3$) or a material with a dielectric constant (k) substantially greater than about 10.

2. The semiconductor device of claim 1, wherein the dielectric layer is disposed conformal to the high absorption structure of the substrate.

3. The semiconductor device of claim 1, wherein the high absorption structure includes a continuous surface along the surfaces of each of the plurality of first protrusions and the surfaces of each of the plurality of first recesses, and the dielectric layer is disposed along the continuous surface.

4. The semiconductor device of claim 1, wherein the high absorption structure includes a first continuous surface, and the dielectric layer includes a second continuous surface, and the first continuous surface is substantially same profile and/or shape as the second continuous surface.

5. The semiconductor device of claim 1, wherein the dielectric constant (k) of the material is in a range of about 10 to about 60.

6. The semiconductor device of claim 1, wherein the dielectric layer is disposed along an outer surface of the high absorption structure.

7. The semiconductor device of claim 1, wherein the substrate and the high absorption structure include silicon.

8. The semiconductor device of claim 1, wherein the dielectric layer is disposed between the high absorption structure and the oxide layer.

9. The semiconductor device of claim 1, further comprising a passivation layer disposed over the dielectric layer, thereby the dielectric layer is disposed between the high absorption structure and the passivation layer.

10. The semiconductor device of claim 1, wherein the high absorption structure and the dielectric layer are configured to absorb the electromagnetic radiation and generate an electrical energy in response to the absorption of the electromagnetic radiation.

11. The semiconductor device of claim 1, wherein a height of each of the plurality of first protrusions or the height of each of the plurality of first recesses is about 0.2 µm to about 0.6 µm.

12. A semiconductor device, comprising:
a substrate including a front side, a back side opposite to the front side, a plurality of first protrusions protruded from the back side of the substrate and a plurality of first recesses indented towards the front side of the substrate, wherein several of the first protrusions and several of the first recesses are alternately disposed to form a rough surface, and the plurality of first protrusions have various shapes;
a pixel device disposed on the front side and surrounded by a passivation, wherein the rough surface overlaps the pixel device;
a high dielectric constant (high k) dielectric film disposed over and conformal to the plurality of first protrusion and the plurality of first recesses; and
an oxide layer disposed over the high k dielectric film and including a plurality of second protrusions protruded towards the front side of the substrate and a plurality of second recesses indented towards the back side of the substrate,
wherein the plurality of second protrusions are disposed within the plurality of first recesses respectively, the plurality of first protrusions are disposed within the plurality of second recesses respectively, the high k dielectric film is disposed between the plurality of first protrusions, the plurality of first recesses, the plurality of second protrusions and the plurality of second recesses, the high k dielectric film includes Hafnium oxide ($HfO_2$), Praseodymium Oxide ($Pr_2O_3$) or a material with a dielectric constant (k) substantially greater than about 10.

13. The semiconductor device of claim 12, wherein at least one of the plurality of first protrusions is in a substantially conical or cylindrical shape.

14. The semiconductor device of claim 12, wherein a thickness of the high k dielectric film is about 0.0001 um to about 10 um.

15. A method of manufacturing a semiconductor device, comprising:
receiving a substrate including a front side and a back side opposite to the front side;
disposing at least a pixel device over the front side of the substrate;
grinding the substrate from the back side to thin down the substrate;
forming a high absorption structure over the back side;
depositing a dielectric layer over the high absorption structure; and
disposing an oxide layer over the dielectric layer,
wherein the high absorption structure includes a plurality of first protrusions protruded from the back side of the substrate and a plurality of first recesses indented towards the front side of the substrate, several of the first protrusions and several of the first recesses are alternately disposed to form a rough surface overlapping the pixel device, the plurality of first protrusions have various shapes, the plurality of first recesses have various shapes, the oxide layer includes a plurality of second protrusions protruded towards the front side of the substrate and a plurality of second recesses indented towards the back side of the substrate, the plurality of second protrusions are disposed within the plurality of first recesses respectively, the plurality of first protrusions are disposed within the plurality of second recesses respectively, the dielectric layer is disposed along surfaces of each of the plurality of first protrusions, surfaces of each of the plurality of first recesses, surfaces of each of the plurality of second protrusions and surfaces of each of the plurality of second recesses, the dielectric layer includes Hafnium oxide ($HfO_2$), Praseodymium Oxide ($Pr_2O_3$) or a material with a dielectric constant (k) substantially greater than about 10.

16. The method of claim 15, wherein the depositing the dielectric layer includes forming a continuous layer of the dielectric layer along the surfaces of each of the plurality of first protrusions and the surfaces of each of the plurality of first recesses.

17. The method of claim 15, wherein the plurality of second protrusions and the plurality of second recesses are formed upon the disposing of the oxide layer over the dielectric layer.

18. The method of claim 15, wherein the depositing the dielectric layer includes atomic layer deposition (ALD) operations.

19. The method of claim 15, wherein the plurality of first protrusions and the plurality of first recesses are formed by removing portions of the substrate over the back side by photolithography operations and etching operations.

20. The method of claim 15, wherein the disposing the pixel device is before forming the high absorption structure.

* * * * *